United States Patent [19]
Vilsmeier et al.

[11] Patent Number: 5,643,268
[45] Date of Patent: Jul. 1, 1997

[54] FIXATION PIN FOR FIXING A REFERENCE SYSTEM TO BONY STRUCTURES

[75] Inventors: Stefan Vilsmeier, Poing; Stefan Lippstreu, Markt Schwaben; Michael Bertram, Heimstetten, all of Germany

[73] Assignee: BrainLAB Med. Computersysteme GmbH, Poing, Germany

[21] Appl. No.: 526,515

[22] Filed: Sep. 11, 1995

[30] Foreign Application Priority Data

Sep. 27, 1994 [DE] Germany .................. 44 34 519.4

[51] Int. Cl.⁶ ..................................... A61B 17/00
[52] U.S. Cl. .................. 606/73; 606/72; 606/130
[58] Field of Search .................. 606/54, 59, 60, 606/65, 66, 72, 73, 76, 104, 130

[56] References Cited

U.S. PATENT DOCUMENTS

| | | | |
|---|---|---|---|
| 3,579,831 | 5/1971 | Stevens et al. | 606/73 X |
| 3,790,507 | 2/1974 | Hodosh | 606/72 X |
| 4,397,307 | 8/1983 | Keller | 606/130 |
| 4,612,930 | 9/1986 | Bremer | 606/130 |
| 4,858,603 | 8/1989 | Clemow et al. | 606/60 X |
| 4,869,242 | 9/1989 | Galluzo | 606/59 |
| 5,006,122 | 4/1991 | Wyatt et al. | 606/130 |
| 5,026,374 | 6/1991 | Dezza et al. | 606/73 X |
| 5,122,132 | 6/1992 | Bremer | 606/72 |
| 5,197,965 | 3/1993 | Cherry et al. | 606/54 |
| 5,397,329 | 3/1995 | Allen | 606/73 |
| 5,437,674 | 8/1995 | Worcel et al. | 606/65 X |

FOREIGN PATENT DOCUMENTS

| | | | |
|---|---|---|---|
| 2101488 | 1/1983 | United Kingdom | 606/72 |

*Primary Examiner*—Sam Rimell
*Attorney, Agent, or Firm*—Dann, Dorfman, Herrell and Skillman; Henry H. Skillman

[57] ABSTRACT

The present invention pertains to a fixation pin for fixing a reference system, especially a head ring for stereotactic treatment, to bony structures, which pin has a shaft made of plastic material with an outside thread, a coupling shoulder for a screwdriver and a point holder, and it has a point, which is held by the point holder. The point has a conical front end, in which case the point is made of a semiprecious stone material.

14 Claims, 2 Drawing Sheets

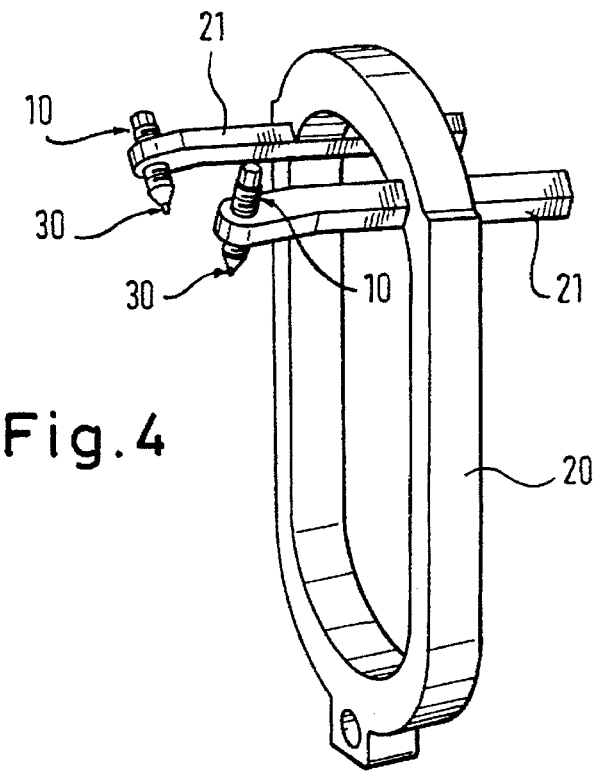
Fig.4
Fig.5
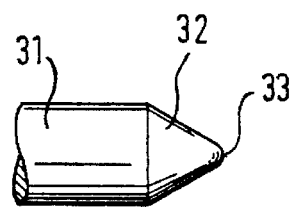
Fig.6
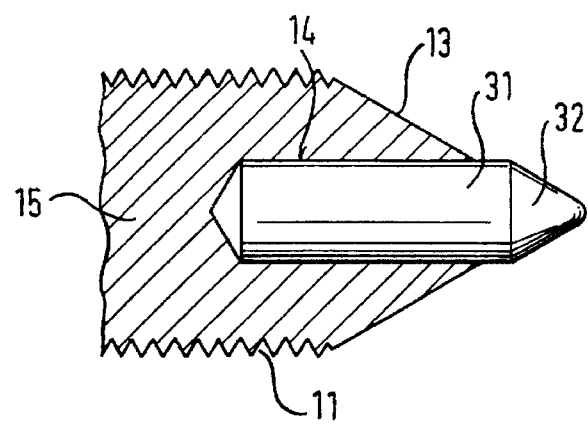
Fig.7
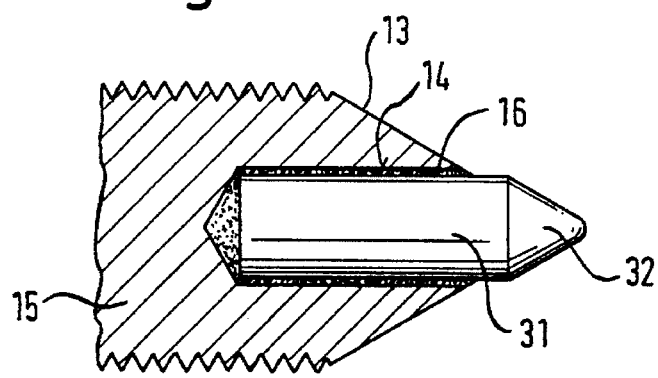

FIXATION PIN FOR FIXING A REFERENCE SYSTEM TO BONY STRUCTURES

FIELD OF THE INVENTION

The present invention pertains to a fixation pin for fixing a reference system, especially a head ring for stereotactic treatment, to bony structures.

BACKGROUND OF THE INVENTION

Such reference systems are used, especially in neurosurgery, to localize a section of the body to be treated by means of determining the coordinates and to be able to accurately redetermine its position for treatment at any time.

An example for the use of such a reference system is a head ring, which is used for the stereotactic treatment of tumors, vascular deformities or the like present in the human brain. In this case, the head ring is fixed on the head of the patient, a brain tumor that is possibly present is localized by means of computerized tomography and its position with regard to the head ring is determined exactly, whereupon treatment instruments can be placed onto the head ring. Such treatment instruments can then also be available at the precise point for invasive or noninvasive therapy by means of a system of coordinates plotted against the reference system, i.e., the head ring in this case.

According to the state of the art, the reference systems—described here as a head ring by way of example—have vertical rods attached to the head ring, and tapholes are cut into the upper ends of the vertical rods. By means of these tapholes, fixation pins with a point are screwed in from the outside in the direction of the head, which penetrate slightly into the bony structures of the head while the head ring is being applied and fixed to the head through the scalp and thus can guarantee a firm fit of the head ring.

Various embodiments of such fixation pins are well known. Common prerequisites for the function of these fixation pins are:

In the first place, the pins must be stable enough to be able to provide a reference system with a secure hold. Furthermore, they should be made of a low-density non-magnetic material in order to exert as few interferences as possible in a tomograph during the localization of the diseased section. To be able to produce the fixation pins at a low cost and to satisfy the above prerequisites at the same time, these are usually produced with a shaft made of aluminum or plastic. In this case, the materials used for the points include aluminum, titanium, or even steel. However, points made of soft materials, e.g., restrict the reusability of such fixation pins to the extent that these pins may only be used once and must be disposed of thereafter.

Another disadvantage of these prior-art fixation pins concerns the interfering effect of the metal parts used in them on the computerized tomography and nuclear spin tomography images to be produced. Especially because of metals, particularly if steel points are used, the images obtained appear to be distorted or of low quality on the tomography interference patterns, which stem from the fixation pins and frequently if the pins were arranged awkwardly during the first application of the head ring, such that the entire image can no longer be used, and the procedure must be repeated with a head ring attached to other points.

In addition, the use of fixation pins that can only be used once results in avoidable waste, while, on the other hand, the procurement costs are high, if new fixation pins must be used for each attachment of a head ring.

SUMMARY OF THE INVENTION

The task of the present invention is to provide a fixation pin for a reference system, especially a head ring for stereotactic treatment, for fixing to bony structures, which no longer has the above-mentioned disadvantages.

A reusable fixation pin, which causes as few interferences as possible on tomography or X-ray images and at the same time is stable enough to be used repeatedly, should especially be proposed.

This task is solved by an improved fixation pin for fixing a reference system to bony structures that has a threaded plastic shaft having a coupling at one end and a point holder at the other and a separate point of semi-precious stone material mounted by the same holder.

Practical variants are defined by the claims.

The first fundamental advantage of the pin according to the present invention is that the semiprecious stone materials used for the points cause only very faint shadows or interference patterns in the production of tomography or X-ray images, and therefore, the risk that an image is unusable due to such interference patterns is greatly reduced. This has, above all, an advantageous effect on the treatment costs in the case of the very expensive computerized tomography images. The density of the semiprecious stone materials to be used corresponds to that of aluminum, to a certain extent, but they have a greater strength and stability.

In addition, the very hard points designed according to the present invention make possible a repeated use, whereby the production costs, which appear to be higher at first, rapidly pay for themselves. It is actually possible to sterilize the fixation pins, which have been used once, for reuse at a minimum cost.

Another advantage of the hard, but light points, which produce few interference patterns, arises from the fact that a better hold on the bone structure can be produced than with soft aluminum points. Moreover, the resulting waste can be reduced by means of repeated use.

The shaft of the fixation pin according to the present invention is preferably formed from a glass-fiber-reinforced or carbon-fiber-reinforced plastic. These plastics have a high strength with a very low rate of formation of interference patterns and are remarkably processed for the formation of the outside thread, of the coupling shoulder and of the point holder.

Sapphires or agates are suitable as the preferred semiprecious stone material for the point of the fixation pin. These materials have a sufficient stability with good processability.

In a preferred variant of the fixation pin according to the present invention, the point, together with the point holder, has a conical design with a cone angle of 50° to 70°, and especially ca. 60°, and it is ground out, on its full end, into a sphere having a very small radius. A trouble-free application and penetration of the point into the bone structure is guaranteed in the above-mentioned angle range. By means of the cylindrical grinding of the point on its front end, e.g., in the form of a spherical section, the tension points, which would then result when the point comes into contact with bony structures, can be avoided, if this point remains unprocessed, whereby the risk of a premature wearing out of the point or of the formation of a continuous crack in the point material is reduced.

To make the screwing of the fixation pin according to the present invention into the tapholes of the vertical rods easier and to provide a slip-free coupling shoulder for a screwdriver on the rear end of the fixation pin, the formation of an outer polygonal contour on the rear end of the fixation pin is proposed, which contour should have standard dimensions, so that it can be brought into contact with and operated with common, available tools.

BRIEF DESCRIPTION OF THE DRAWINGS

An embodiment of the fixation pin according to the present invention is shown on the attached sheet of figures, in which:

FIG. 4 shows a perspective view of a conventional heading with fixation pins in place;

FIG. 5 shows an enlarged fragmentary view of the point indicated at V in FIG. 3;

FIG. 6 shows an enlarged fragmentary section of the pan showing a force-fit of the point in the hole of the pin; and FIG. 7 shows a view similar to FIG. 6 showing material bonding the point in the hole of the pin.

DESCRIPTION OF THE PREFERRED EMBODIMENTS

Figure 1:
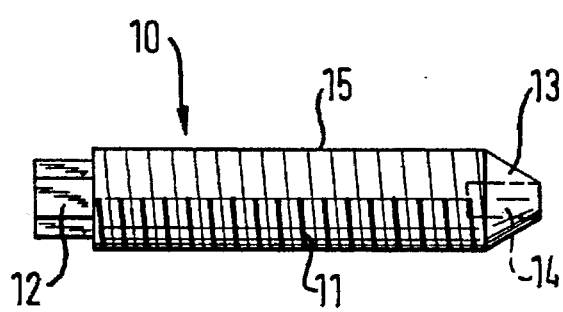
FIG. 1 shows a side view of an embodiment of the fixation pin according to the present invention without inserted point.
Figure 2:
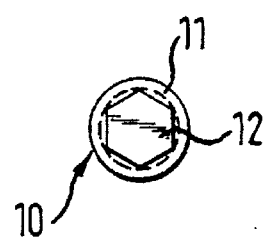
FIG. 2 shows the rear view of the fixation pin according to FIG. 1 with an outer hexagon serving as the coupling shoulder for a screwdriver.

The shaft, shown in the longitudinal view in FIG. 1, of a preferred embodiment of the fixation pin 10 according to the present invention is indicated, as a whole, with the reference number 15. Along its middle section, the shaft 15 has an outside thread 11, by means of which the shaft can be screwed into a taphole of a vertical rod (not shown) in FIG. 1 to be attached, e.g., to a head ring. The rear section of the fixation pin shown forms a coupling shoulder 12 for a screwdriver (not shown) and is designed as an outer hexagon in the embodiment shown here. This is again distinct in FIG. 2, in which the outer hexagon 12 is shown in its rear view. A common screwdriver, which should be provided with a torque limiter to avoid exceedingly high forces, can be attached to this outer hexagon 12 for screwing in the fixation pin 10 and applying the necessary feed force for the point of the fixation pin 10 to penetrate into the bony structure.

On the front end of the shaft 15, the shaft has a conical design in the form of a truncated cone, and thus, it forms a point holder 13, which has a blind hole 14, which is inserted from the front to accommodate a cylinder-shaped part 31 of a point 30 (see FIG. 3) and which extends far enough into the cylindrical part of the shaft 15 to guarantee a secure hold of the point 30. The cone angle of the point holder 13 corresponds to that of the point 30 to be inserted later, so that no edges appear after the insertion.

Glass-fiber-reinforced or carbon-fiber-reinforced plastics, which do not leave behind any shadows or interference patterns on X-ray or tomography images, are used as the material for the shaft 15 of the pin 10.

Figure 3:
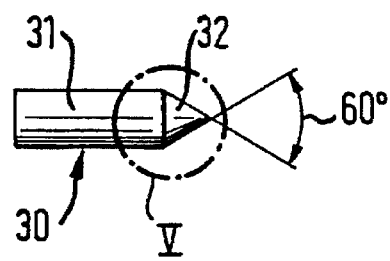
FIG. 3 shows a point for the fixation pin according to the present invention to be inserted into the shaft according to FIG. 1.

In a somewhat enlarged view, FIG. 3 shows the point, which can be inserted into the hole 14 of the point holder 13 or of the shaft 15 according to FIG. 1 and which, as a whole, is provided with the reference number 30. The point 30 consists of a rear cylindrical section 31 and a front conical section 32 ground to a conical point. The rear cylindrical section 31 corresponds, in its dimensions, as an exact fit to the hole 14 of the point holder 13 of the shaft 15 of the pin 10, such that a force fit results when the point 30 is inserted into the hole 14. Such a force fit, that is, a combination of positive locking and frictional connection, is one of the possible types of attachment that can be used to fix the point 30 in the shaft 15. Since longitudinal forces that could pull the point 30 out of the shaft 15 of the pin 10 no longer appear in the later use of the fixation pin 10, the strength of such a force fit, which should be created without generating a greater tension in the shaft, is sufficient to guarantee a secure hold of the point 30 in the shaft 15 of the pin 10.

However, other embodiments are also conceivable as a positive locking and/or frictional connection during the attachment of the point 30 in the shaft of the pin 10. Thus, it is possible to provide the shaft 15 of a fixation pin 10 according to the present invention with a new point 30 in the case of possible damage to the point 30 inserted, and therefore, it is possible to reuse it, e.g., by means of using detachable attachment techniques, e.g., bonding techniques or general material closure techniques.

The point 30 consists of a semiprecious stone such as sapphire or agate.

The front, conical section 32 of the point 30, which is ground in the shape of a cone, has a cone angle of about 60° in the embodiment shown. In this design, a trouble-free penetration of the point 30 into the bony structure, as well as a remarkable hold of the point 30 in the shaft are guaranteed.

To prevent burrs from remaining on the front end 32 of the point 30 after the production process, this is ground to a conical section having a very small radius. A point 30, which is ground completely to a point on its front end 32, would be susceptible to crack formations and breaks of all types due to its very small end cross section, when it is exposed to the forces, which appear during the penetration into bony structures. A uniform distribution of force on the front end 32 of the point can be guaranteed by forming and grinding the conical section on the front end 32, and the risk of breaking or cracking can be prevented.

FIG. 4 illustrates a head ring 20 having vertical rods 21 through the end, each of which is threaded the fixation pin 10 carrying the point 30.

FIG. 5 illustrates that the point 30 is ground to a spherical section having a very small radius on its conical front end.

FIG. 6 illustrates the force fit between the cylindrical section 31 and the cylindrical hole 14 when they have an exact fit, which provides a frictional connection and/or positive locking.

FIG. 7 illustrates the embodiment wherein the point 30 is connected in the hole 14 by bonding material 16.

Although the above description is oriented to a considerable extent towards the example of a fixation pin 10 for a head ring, it should be made clear once again at this point that any reference system can be attached by means of the fixation pin 10 according to the present invention to every conceivable bony structure such that, with the secure hold of the reference system, it is possible to produce interference-free tomography images, and reusability is possible at the same time.

We claim:

1. Fixation pin (10) for fixing a reference system, especially a head ring for stereotactic treatment, to bony structures with a shaft (15) made of a plastic material with
an outside thread (11),
a coupling shoulder (12) for a screwdriver, and
a point holder (13), and with
a point (30) with a conical front end (32) held by the point holder (13) characterized in that
the point (30) is made of a semiprecious stone material.

2. Fixation pin in accordance with claim 1, characterized in that the shaft (15) is formed from a fiber-reinforced plastic.

3. Fixation pin in accordance with claim 1, characterized in that the point (30) is ground from a sapphire or agate material.

4. Fixation pin in accordance with claim 1, characterized in that the point (30), together with the point holder (13), have a conical surface with a cone angle of approximately 50° to 70°.

5. Fixation pin in accordance with claim 1, characterized in that said conical front end (32) terminates in a spherical surface.

6. Fixation pin in accordance with claim 1 wherein said shaft has a rear end with a polygonal coupling shoulder (12).

7. Fixation pin in accordance with claim 1, characterized in that the point (30) is connected with the shaft (15) by frictional connection.

8. Fixation pin in accordance with claim 1, characterized in that the point (30) is connected with the shaft (15) by bonding material.

9. Fixation pin in accordance with claim 4 wherein the cone angle is 60°.

10. Fixation pin in accordance with claim 6 wherein said polygonal shoulder is an outer hexagon.

11. In combination with a head ring for stereotactic treatment having vertical posts, a fixation pin for fixing the head ring to bony structures, comprising a shaft made of plastic material having an outside thread threadedly engaged with said vertical post of the head ring, a coupling shoulder for driving engagement with a driver member operable to rotate said shaft within said post, and a point holder at one end of said shaft, a point removably engaged in said point holder, said point being made of semiprecious stone material and operable to be advanced to engage the bony structures by rotation of said shaft post.

12. Fixation pin according to claim 2 wherein said plastic shaft is reinforced with glass fiber.

13. Fixation pin according to claim 2 wherein said plastic shaft is reinforced with carbon fibers.

14. Fixation pin in accordance with claim 7, characterized in that the point (30) is connected with the shaft (15) by positive locking.

* * * * *

UNITED STATES PATENT AND TRADEMARK OFFICE
CERTIFICATE OF CORRECTION

PATENT NO. : 5,643,268

DATED : July 1, 1997

INVENTOR : Stefan Vilsmeier; Stefan Lippstreu; Michael Bertram

It is certified that errors appear in the above-identified patent and that said Letters Patent is hereby corrected as shown below:

Column 3, line 24, change "pan" to --pin--;

lines 37-38, delete "(not shown) in Fig. 1" and insert --(not shown in Fig. 1)--;

Column 4, line 32, delete "this" and insert --the point 30--.

Signed and Sealed this

Thirteenth Day of January, 1998

Attest:

BRUCE LEHMAN

*Attesting Officer*      Commissioner of Patents and Trademarks